United States Patent [19]

Kumada et al.

[11] Patent Number: 5,055,140
[45] Date of Patent: Oct. 8, 1991

[54] THERMOELECTRIC ELEMENT USING SEMICONDUCTIVE CERAMIC MATERIAL

[75] Inventors: Akira Kumada; Norimitsu Kitoh, both of Kyoto, Japan

[73] Assignee: Murata Mfg. Co., Ltd., Japan

[21] Appl. No.: 253,718

[22] Filed: Oct. 5, 1988

[30] Foreign Application Priority Data

Oct. 5, 1987 [JP] Japan .................................. 62-251351
Oct. 5, 1987 [JP] Japan .................................. 62-251352

[51] Int. Cl.$^5$ ............................................ H01L 35/28
[52] U.S. Cl. .................................. 136/212; 136/225; 136/227
[58] Field of Search ............... 136/201, 212, 225, 227, 136/211

[56] References Cited

U.S. PATENT DOCUMENTS

| 3,885,992 | 5/1975 | Wilcox | 136/212 |
| 3,899,359 | 8/1975 | Stachurski | 136/205 |
| 4,111,717 | 9/1978 | Baxter | 136/225 |
| 4,343,960 | 8/1982 | Eguchi et al. | 136/225 |
| 4,363,928 | 12/1982 | Wilson | 136/206 |
| 4,382,154 | 5/1983 | Thery et al. | 136/206 |
| 4,500,741 | 2/1985 | Morimoto et al. | 136/206 |
| 4,687,879 | 8/1987 | Hendricks | 136/212 |
| 4,938,244 | 7/1990 | Kumada et al. | 136/212 |
| 4,983,225 | 1/1991 | Rowe | 136/201 |

Primary Examiner—Peter A. Nelson
Attorney, Agent, or Firm—Ostrolenk, Faber, Gerb & Soffen

[57] ABSTRACT

In order to increase the thermoelectromotive force delivery by a thermoelectric element as a whole or regulate the temperature coefficient of such thermoelectromotive force, n-type semiconductive ceramic members and p-type semiconductive ceramic members are assembled to form such element and are electrically connected with each other. The n-type and p-type semiconductive ceramic members are provided in the form of plate members, which are stacked so as to be interconnected by insulating layers and conductor layers. The insulating and conductor layers are provided on opposite surfaces of adjacent plate members by thick film printing and baking performed thereafter.

12 Claims, 5 Drawing Sheets

FIG. 6
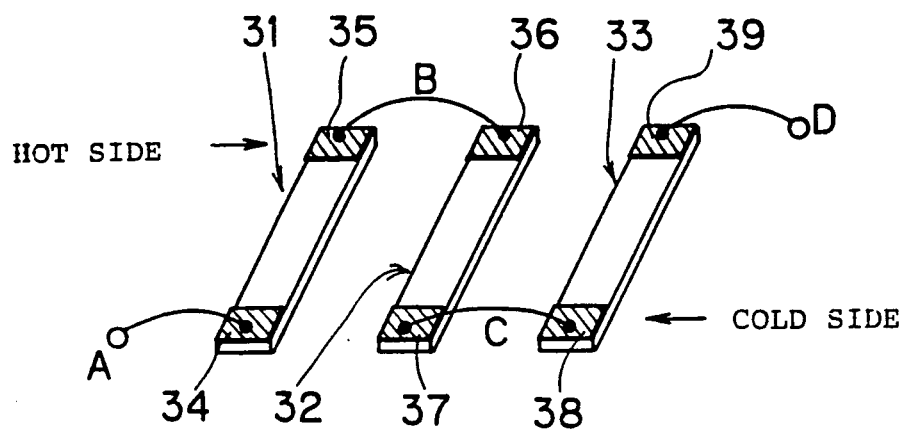
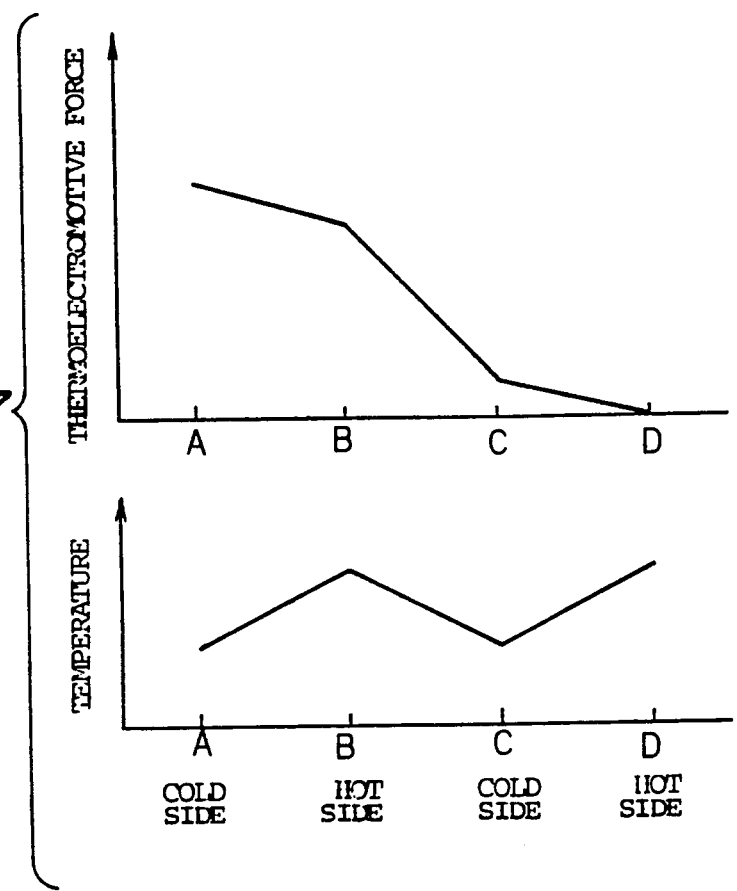
FIG. 7

THERMOELECTRIC ELEMENT USING SEMICONDUCTIVE CERAMIC MATERIAL

CROSS-REFERENCE TO RELATED APPLICATION

This is related to Ser. No. 07/253,719 filed Oct. 5, 1988 in the name of Akira Kumada et al. and titled TEMPERATURE DIFFERENCE DETECTING ELEMENT USING SEMICONDUCTIVE CERAMIC MATERIAL.

BACKGROUND OF THE INVENTION

Field of the Invention

The present invention relates to a thermoelectric element using semiconductive ceramic materials, and more particularly, it relates to an improvement in a mode of electrically connecting a plurality of semiconductor members which are made of semiconductive ceramic materials with each other.

Description of the Prior Art

It is widely known that various substances have thermoelectric power based on Seebeck effects. An electromotive force generated by such thermoelectric power may be utilized in a thermocouple, a thermoelectric element or the like, and these have already been widely put to practical use. Examples of materials having characteristic values which are suitable for such practical use are an intermetallic compound, a semimetal compound and a semiconductor.

Among these, semiconductor are higher in thermoelectric power than the other materials, and are suitable for use in a thermoelectric element in a power supply. Such a semiconductor has either a positive or negative electromotive force, depending on the polarity of the majority carriers contained therein. For example, a hot side is positive in the case of n-type carriers and negative in the case of p-type carriers. It is well known to join an n-type semiconductor material with a p-type semiconductor material to provide a temperature contact at the junction therebetween, thereby to increase the thermoelectromotive force which is delivered as a whole.

For example, oxides of iron and silicon are mixed to form an iron-silicon compound to semiconductorize the same and form a p-n junction, by mixing pulverulent raw materials with each other, pressure molding, and then sintering, thereby obtaining such a p-n junction. On the other hand, a semiconductor manufacturing process may be used to form a p-n junction on a silicon substrate, through a technique such as ion implantation or CVD.

In the case of semiconductive ceramic, materials however, it is generally difficult to form a junction between a p-type semiconductive ceramic material and an n-type semiconductive ceramic material, unlike in the aforementioned examples of the semiconductor materials other than semiconductive ceramic materials.

One problem that may occur is that, in the case of a semiconductive ceramic material which is obtained by semiconductorizing metallic atoms of metal oxide ceramic in an excess or deficit state, a layer of the original metal oxide may be defined at the p-n junction portion, and this will greatly increase the resistance of the element, such that the element cannot be applied to practical use. Also in a semiconductive ceramic materials which is semiconductorized by valency control, a p-n junction may not be sufficiently formed due to diffusion of additives.

The foregoing description has concerned the case of forming a p-n junction by a step of firing semiconductive ceramic materials. On the other hand, however, semiconductive ceramic materials may also be electrically connected with each other in a later step, after they have already been fired, to implement a p-n junction through such connection. However, fired semiconductive ceramic materials cannot be directly subjected to soldering, and hence any such soldering step must be carried out after performing metallization by appropriate means.

For example, FIG. 11 shows a device disclosed in Japanese Patent Laying-Open Gazette No. 114090/1979, in which a plurality of semiconductive ceramic members 1 to 4 of reduction type titanium oxide are respectively provided with ohmic electrodes 5 to 12, by a method such as vapor deposition or thick film printing. The electrodes 5 to 12 are sequentially soldered through lead wires 13 to 17 to connect the semiconductive ceramic members 1 to 4 in series with each other, in order to increase the total output by this multistage series connection of the semiconductive ceramic members 1 to 4. In this prior art example, therefore, the operation for electrically connecting the semiconductive ceramic members 1 to 4 is complicated, and the element obtained cannot be compact.

Generally speaking, there are two main uses for such thermoelectric elements. Thermoelectric elements are of great importance for use in a power supply, and hence various efforts have been made to increase the thermoelectromotive force which is delivered by the element as a whole.

On the other hand, a thermoelectromotive force generated by a Seebeck effect can also be put to use in a temperature detecting element, for example. A thermocouple is typically used as such a temperature detecting element. The thermocouple is adapted to utilize the fact that a thermoelectromotive force generated across a junction between two types of different metals varies with the junction temperature. Such thermoelectromotive force, being 40 to 80 $\mu$V/K, for example, is relatively small since the Seebeck factors of metals are generally small. Nevertheless, such a thermocouple has been widely used since the temperature coefficient of the thermoelectromotive force is relatively small and hence the temperature coefficient can be easily corrected.

In recent years, microprocessor-based techniques have been applied in the field of temperature and temperature difference measurement, whereby a measuring apparatus of high performance can be provided at a low cost. In particular, the performance of the signal processing systems in such measuring system has been greatly improved. Hence, improvement in the sensitivity of the detecting element would also be highly desirable. However, the thermoelectromotive force generated by such a conventional thermocouple has heretofore been insufficient, in view of this improvement in sensitivity.

On the other hand, thermoelectric elements have been developed mainly for use in supplies power, as hereinabove described. A material for such an element is selected from the system of $Bi_2Te_3$, $Bi_2Sb_2Te_{15}$, FeSi, Si-Ge and the like, for example. These materials, having relatively large Seebeck factors of 0.2 to 0.6 mV/K, are apparently suitable for providing highly sensitive temperature detecting elements.

However, such a thermoelectric element developed for use in a power supply is generally to be used in a high temperature range of 300° to 800° C., and furthermore, such thermoelectric elements are to be provided with large temperature gradients, i.e., a temperature difference of hundreds of degrees. Further, efforts toward increasing the Seebeck factor have been merely directed toward improving the conversion efficiency. In the type of thermoelectric element developed for use in a power supply, therefore, no consideration is generally given to linearity in the temperature coefficient. Further, the mechanical strength thereof is rather insufficient. Accordingly, the present inventors have realized that there is a need for further improvement in the sensitivity of a thermoelectric element for use in temperature detection.

It is well know in the art that semiconductive ceramic material is larger in thermoelectromotive force than metal by at least an order of magnitude. For example, it has been reported by Saburi, in the Journal of the Physical Society of Japan, 1959, that $BaTiO_3$ has a thermoelectromotive force of 860 $\mu V/K$. Such a semiconductive ceramic may contribute to further improvement in the sensitivity of a temperature detecting element since it has passable mechanical strength and is capable of generating a thermoelectromotive force which is higher than that of the aforementioned materials that were developed for use in a power supply. However, semiconductive ceramic also has the problem that the temperature coefficient of thermoelectromotive force is relatively high. Thus, it is difficult to directly apply the semiconductive ceramic for use in a highly sensitive temperature detecting element, but some temperature coefficient correcting means is required.

SUMMARY OF THE INVENTION

An object of the present invention is to provide a thermoelectric element using a semiconductive ceramic, which can easily be utilized in an electrical connection of a plurality of semiconductive ceramic members.

Another object of the present invention is to provide an improvement for easily miniaturizing or reducing the size of a thermoelectric element which comprises a plurality of electrically connected semiconductive ceramic members.

Still another object of the present invention is to provide a thermoelectric element using a semiconductive ceramic, which is adapted to increase thermoelectromotive force delivered as a whole.

A further object of the present invention is to provide a means for enabling substantially arbitrary regulation of the temperature coefficient of thermoelectromotive force which is delivered as a whole in a thermoelectric element using semiconductive ceramic.

A thermoelectric element according to the present invention comprises a plurality of plate members which are made of semiconductive ceramic materials each showing Seebeck effects respectively. Each of the plate members has first and second surfaces which are opposite to each other. The plurality of plate members are so stacked that the first surfaces and the second surfaces of adjacent members face each other. Between each pair of first and second surfaces facing each other in such a stacked arrangement, an insulating layer and a conductor layer are adjacently provided to be in contact with both of the first and second surfaces.

Thus, according to the present invention, a plurality of semiconductive ceramic members are provided in the form of plate members, which are so stacked that the entire thermoelectric element is miniaturized or reduced in size even if a large number of semiconductive ceramic members are combined with each other. When the element is thus reduced in size, its thermal capacity can be reduced so that small temperature gradients applied to the element can be sensitively detected.

Further, the plurality of plate members of semiconductive ceramic materials are electrically connected with each other through the conductor layers while avoiding connection in undesired portions by means of the insulating layers between adjacent pairs of the stacked plate members, thereby making it unnecessary to employ a complicated connecting operation such as soldering through use of lead wires.

Thermoelectromotive force delivered by the element as a whole can be increased by connecting n-type and p-type semiconductive ceramic members in series with each other by the aforementioned manner of electrical connection.

Ceramic semiconductor materials respectively have Seebeck factors which are specific thereto. When a plurality of semiconductive ceramic members having different Seebeck factors are electrically connected in series or parallel with each other, the temperature coefficient of the thermoelectromotive force generated by the entire element can be varied by selecting the combination of such a plurality of semiconductive ceramic members. Thus, according to the thermoelectric element of the present invention, the temperature coefficient of thermoelectromotive force can be substantially arbitrarily regulated depending on the mode of combination of the semiconductive ceramic members. Thus it is possible to obtain a thermoelectric element which has an output characteristic of thermoelectromotive force whose temperature coefficient is nearly zero, for example.

According to the present invention, further, semiconductive ceramic members having relatively high thermoelectromotive force can be so applied to temperature detection as to form a highly sensitive temperature detecting element.

In a preferred embodiment of the present invention, the insulating layers and conductor layers are formed by thick film printing. The plate members are stacked when the insulating layers and the conductor layers are printed but not yet baked. The plate members are fixed together in a stacked arrangement by baking the insulating layers and the conductor layers. With such structure, the insulating layers and the conductor layers can also serve as joining materials for fixing the stacked plate members, in addition to performing the original electrical functions thereof.

Preferably the n-type semiconductive ceramic members are mainly composed of Ba-Ti oxide and the p-type semiconductive ceramic members are mainly composed of Ni-Mn-Cu oxide.

More preferably, the conductor layers define ohmic junction electrodes so that a p-n junction is obtained via the connection through the ohmic junction electrodes. Thus, no rectification characteristic appears at the p-n junction, so there is no restriction of the direction of temperature gradients that may be applied to the element.

BRIEF DESCRIPTION OF THE DRAWINGS

FIG. 6 is a perspective view illustrating the arrangement of electrical connections employed in a thermoelectric element according to another embodiment of the present invention;

FIG. 7 is a graph showing thermoelectromotive force obtained by the thermoelectric element shown in FIG. 6 in contrast to temperature gradients;

DESCRIPTION OF THE PREFERRED EMBODIMENTS

Figure 1:
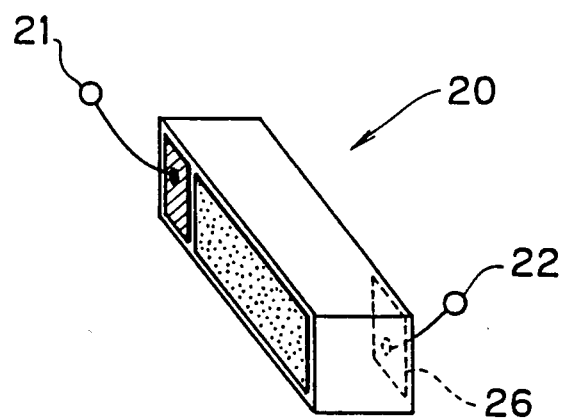
FIG. 1 is a perspective view showing the appearance of a thermoelectric element 20 according to an embodiment of the present invention.

FIG. 1 is a perspective view showing the appearance of a thermoelectric element 20 according to an embodiment of the present invention. This thermoelectric element 20 comprises n-type and p-type semiconductive ceramic members which are connected in series with each other in a multistage manner in order to increase the entire thermoelectromotive force delivered across external terminals 21 and 22, although the detail of such structure is not shown in FIG. 1. In order to clarify the structure of the thermoelectric element 20 shown in FIG. 1, a method of manufacturing the same is now described with reference to FIGS. 2 to 5.

Figure 2:
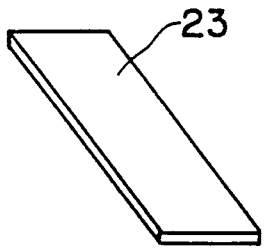
FIG. 2 is a perspective view showing a plate member 23 which is prepared to obtain the thermoelectric element 20 shown in FIG. 1.

First, each of the n-type and p-type semiconductive ceramic members is prepared in the form of a plate member 23, as shown in FIG. 2. In this stage, the semiconductive ceramic material forming the plate member 23 is already fired.

Figure 3:
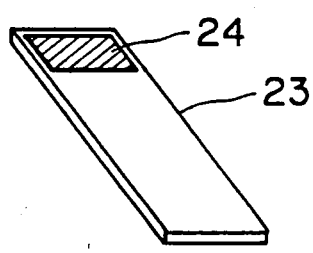
FIG. 3 is a perspective view showing the plate member 23 provided with a conductor layer 24 on its first surface.
Figure 4:
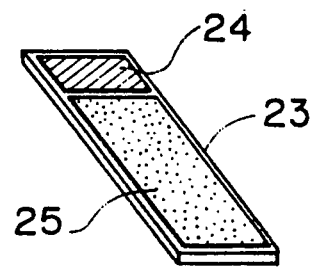
FIG. 4 is a perspective view showing the plate member 23 further provided with an insulating layer 25 on the first surface.

Then, a conductor layer 24 is formed by thick film printing in a position close to a longitudinal end one (first) surface of the plate member 23, as shown in FIG. 3.

Thereafter an insulating layer 25 is formed by thick film printing substantially entirely over the said first surface of the plate member 23 except for the region provided with the conductor layer 24.

The insulating layer 25 may be provided previous to formation of the conductor layer 24.

Figure 5:
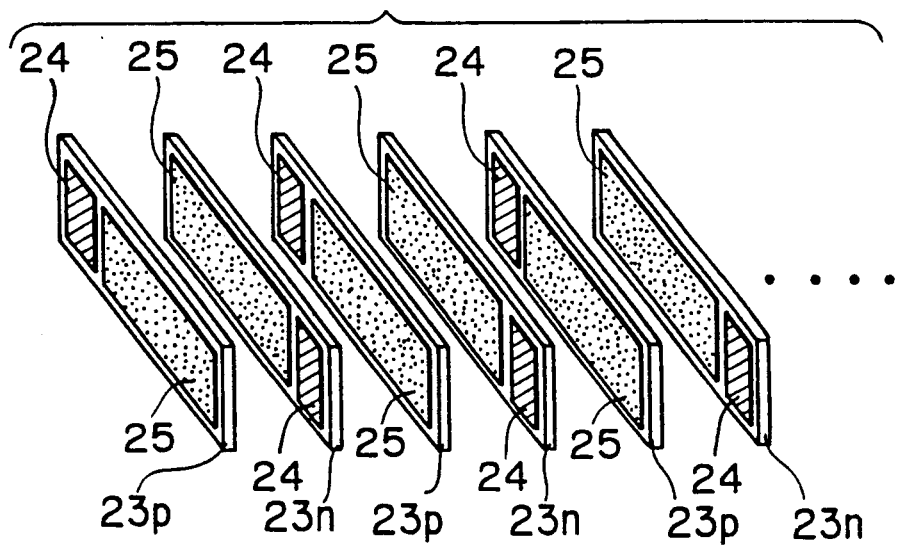
FIG. 5 is an exploded perspective view separately showing a plurality of plate members 23p and 23n included in the thermoelectric element 20 shown in FIG. 1.
Figure 11:
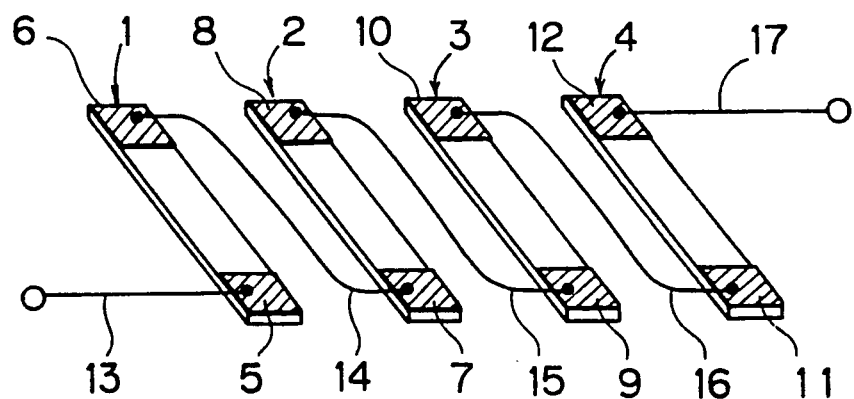
FIG. 11 is a perspective view illustrating a conventional thermoelectric element having a multistage series connection structure.

Then, a plurality of such plate members 23 are stacked in positional relation shown in FIG. 5. Referring to FIG. 5, numeral 23p indicates plate members of a p-type semiconductive ceramic material and numeral 23n indicates plate members of an n-type semiconductive ceramic material. The p-type plate members 23p and the n-type plate members 23n are so alternately stacked with each other that the conductor layers 24 of the p-type plate members 23p are positioned at the opposite ends of the plate members from the conductor layers 24 of the n-type plate members 23n along the longitudinal direction of the plate members 23p and 23n.

After the plate members 23p and 23n are thus stacked, the conductor layers 24 and the insulating layers 25 formed by thick film printing are baked. Thus, the plate members 23p and 23n are mechanically fixed in a stacked arrangement.

The thermoelectric element 20 shown in FIG. 1 is thus obtained in an integrally laminated state. In this thermoelectric element 20, the plate members 23p and 23n are connected in series with each other by the conductor layers 24, along the longitudinal direction of each of the plate members 23p and 23n.

The external terminals 21 and 22 are extracted from endmost ones of the series-connected plate members 23p and 23n, as shown in FIG. 1. Referring to FIG. 1, the first external terminal 21 is directly connected to the conductor layer 24 provided on the leftmost plate member 23p shown in FIG. 5, for example. The second external terminal 22 is connected to a conductor layer 26, which may be provided on the rightmost plate member 23p, for example, on a (second) surface opposite to the first surface provided with the conductor layer 24 at the longitudinally opposite end of the element. Or, such a conductor layer 26 may be prepared by extending the conductor layer 24 provided on the first surface of the rightmost plate member 23n, for example, to the opposite surface. In this case, the conductor layer 26 may alternatively be provided at the longitudinally opposite end of the second surface of the rightmost plate member 23n.

An experiment which was carried out in relation to the above embodiment will now be described.

An n-type semiconductive ceramic material was prepared from a positive temperature coefficient thermistor material which was obtained by adding samarium to $BaTiO_3$. A p-type semiconductive ceramic material was prepared by adding CuO to $NiMn_2O_4$. Thermoelectric power of the n-type semiconductive ceramic material was 730 $\mu V/K$ at 20° C. while that of the p-type semiconductive ceramic material was $-160$ $\mu V/K$ at 20° C. Ohmic silver paste and glass frit paste were screen-printed on one surface of each of plate members formed by the n-type and p-type semiconductive ceramic materials, to provide a conductor layer and an insulating layer respectively. After the printed paste members were dried, the n-type and p-type plate members were alternately stacked to be electrically connected in series with each other. Then the stacked plate members were heated by a hot plate to be connected with each other under pressure, thereby to obtain a laminate. Thereafter the laminate was baked in a tunnel kiln which was set at a temperature of 800° C., thereby to obtain a sintered laminate. The number of laminations was 10.

Temperature difference of 5° C. was applied across this sample in an atmosphere of 20° C., whereby thermoelectromotive force of 8.4 mV/K was obtained.

Although in the preceding embodiment, both the insulating layer and the conductor layer are provided on the first surface of each plate member during the manufacturing process, the conductor layer and the insulator layer may also be provided separately from each other on either of the opposite first and second surfaces, in such a way that the insulating layers and the conductor layers are interposed between adjacent ones of the plate members as the result. Or, both of conductor layers and insulating layers may be provided on each of the respective facing surfaces of each pair of plate members. Further, the insulating layer and the conductor layer formed by thick film printing may be fired in advance to stacking of the plate members, which in turn may be mechanically fixed in a stacked arrangement by means of another material or member.

The thermoelectric element according to the above embodiment has a tendency to increase the equivalent series resistance since series connection is achieved through the conductor layers. However, such equivalent series resistance is not substantially problematic when the thermoelectric element is applied to use in a sensing element such as a heat flow sensor or an infrared sensor, for example, since the sensitivity is extremely advantageously improved by the increase in element output.

The aforementioned embodiment is mainly directed to increase the thermoelectromotive force delivered from the entire thermoelectric element through the structure and the mode of electrical connection described with reference to FIGS. 1 to 4. Another embodiment of the present invention, which is mainly adapted to regulate the temperature coefficient of thermoelectromotive force, will now be described.

FIG. 6 is a simplified view of an embodiment which is adapted to regulate the temperature coefficient of thermoelectromotive force delivered from the entire thermoelectric element. Referring to FIG. 6, portions corresponding to the conductor layers 24 in the above embodiment are indicated by electrodes 35 to 38 and connections B and C, in order to facilitate understanding of the state of electrical connection of the thermoelectric element. However, it is to be noted that such electrical connection is achieved by insulating layers and conductor layers which are provided to be adjacent to each other between opposite surfaces of a plurality of stacked plate members, similarly to the above embodiment of FIGS. 1-5.

Referring to FIG. 6, the thermoelectric element is formed by three plate members of semiconductive ceramic, i.e., three semiconductive ceramic members 31, 32 and 33 which are electrically connected in series with each other. Electrodes 34 and 35, 36 and 37, and 38 and 39 are illustrated on respective both ends of the semiconductive ceramic members 31, 32 and 33. Terminals A and D are connected to the electrodes 34 and 39 respectively, while the connection B for connecting the electrodes 35 and 36 and the connection C for connecting the electrodes 37 and 38 are illustrated so that the electrodes 34 to 39 are connected in series with each other in this order. The respective semiconductive ceramic members 31, 32 and 33 are provided with temperature gradients so that the electrodes 35, 36 and 39 are at higher temperatures than the electrodes 34, 37 and 38 respectively.

Within the semiconductive ceramic members 31, 32 and 33, the intermediate member 32 is formed of an n-type semiconductive ceramic material which is prepared from $BaTiO_3$ doped with Sm. Both of the remaining semiconductive ceramic members 31 and 33 are formed of a p-type semiconductive ceramic material which is prepared from $NiMn_2O_4$ doped with Cu.

The thermoelectric element formed by the three semiconductive ceramic members 31, 32 and 33, which are connected with each other in the state shown in FIG. 6, generates thermoelectromotive force as particularly shown in an upper part of FIG. 7. Referring to FIG. 7, temperature gradients are shown in a lower part, while symbols A, B, C and D correspond to the terminals and connections A, B, C and D respectively. When the temperature gradients shown in the lower part of FIG. 7 are applied, the thermoelectromotive force shown in the upper part is generated across A and B, B and C, and C and D respectively. Thus, when the three semiconductive ceramic members 31, 32 and 33 are connected in series with each other as shown in FIG. 6, thermoelectromotive force in total of those appearing across the semiconductive ceramic members 31, 32 and 33 is generated across the terminals A and D.

Figure 8:
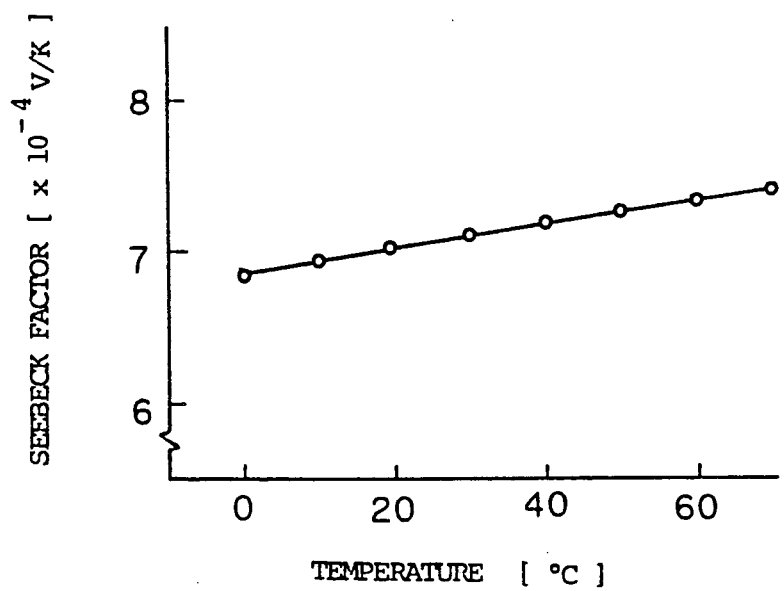
FIG. 8 is a graph showing the temperature characteristic of the Seebeck factor of the semiconductive ceramic member 32 shown in FIG. 6.

FIG. 8 shows the temperature characteristic of thermoelectromotive force generated by the intermediate semiconductive ceramic member 32 shown in FIG. 6. The semiconductive ceramic member 32 has such a tendency that the Seebeck factor is substantially linearly increased as a function of a temperature rise within an ordinary temperature range. It has been confirmed that such temperature characteristic is substantially common to n-type semiconductive ceramic materials, aside from difference in thermoelectromotive force/voltage.

Figure 9:
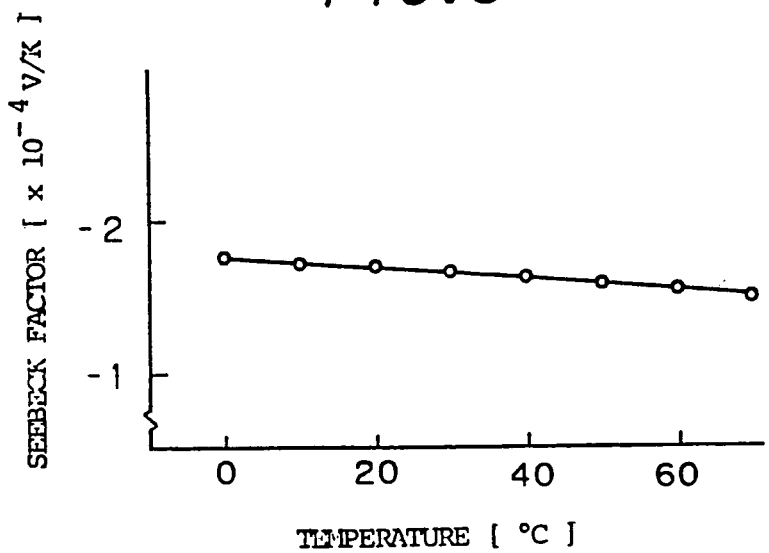
FIG. 9 is a graph showing the temperature characteristic of the Seebeck factor of the semiconductive ceramic member 31 or 33 shown in FIG. 6.

FIG. 9 shows the temperature characteristic of thermoelectromotive force of the semiconductive ceramic member 31 or 33. The semiconductive ceramic member 31 or 33 also has such a tendency that the Seebeck factor is increased as a function of temperature rise within an ordinary temperature range, although thermoelectromotive force is inverted in polarity. That is, the Seebeck factor is negative and decreases in absolute value as the temperature increases. It has been also confirmed that such a tendency is substantially common to p-type semiconductive ceramic materials.

Figure 10:
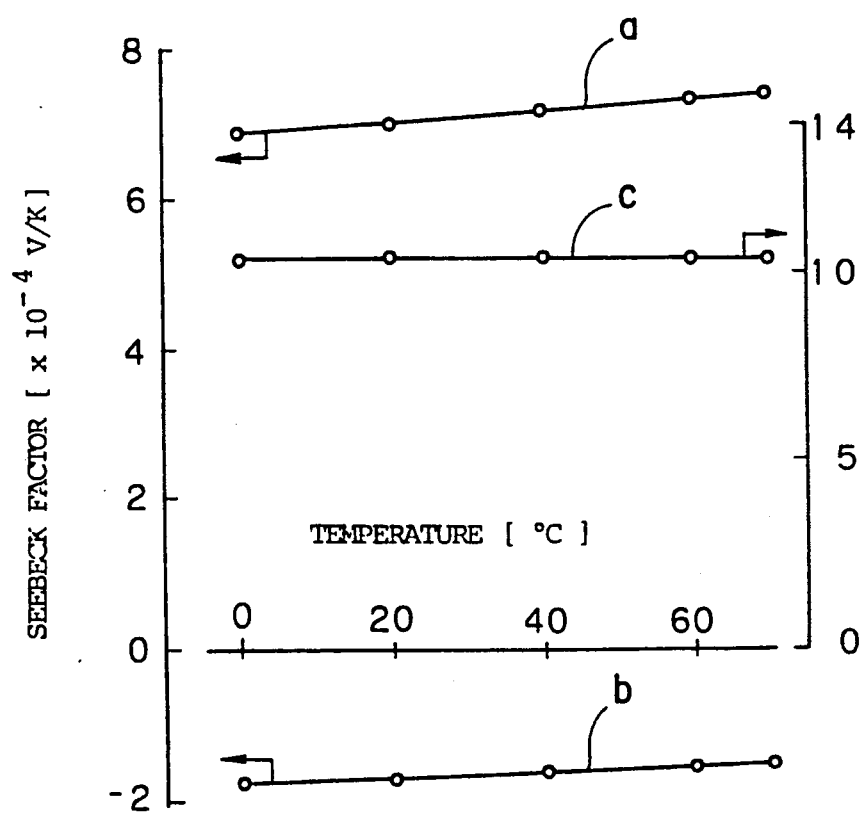
FIG. 10 is a graph showing the temperature characteristic of the Seebeck factor of the entire thermoelectric element shown in FIG. 6 with the temperature characteristics of the respective semiconductive ceramic members 32 and 31 or 33.

FIG. 10 shows the temperature characteristic of the overall Seebeck factor of the semiconductive ceramic members 31, 32 and 33 which are combined with each other as shown in FIG. 6, with the temperature coefficients of the respective semiconductive ceramic members 32 and 31 or 33. Referring to FIG. 10, symbol a indicates the temperature characteristic of the semiconductive ceramic member 32 and symbol b indicates that of the semiconductive ceramic member 31 or 33, in correspondence to the left axis of ordinates. Symbol c indicates the overall temperature characteristic of the semiconductive ceramic members 31, 32 and 33 which are connected with each other as shown in FIG. 6, in correspondence to the right axis of ordinates shown in FIG. 10.

The following relation holds for the respective Seebeck factors a, b and c shown in FIG. 10:

$$c = a - b \times 2$$

In this relational expression, the Seebeck factor a of the semiconductive ceramic member 32, the Seebeck factor b of the semiconductive ceramic member 31 or 33 and the entire Seebeck factor c in the mode of connection shown in FIG. 6 at a temperature of 0° to 70° C. are expressed as follows:

| Temperature | a | b | c |
| --- | --- | --- | --- |
| 0 | 6.78 | −1.74 | 10.3 |
| 20 | 7.01 | −1.69 | 10.4 |
| 40 | 7.19 | −1.61 | 10.4 |
| 60 | 7.33 | −1.52 | 10.4 |
| 70 | 7.38 | −1.48 | 10.3 |

In the above Table and FIG. 10, temperatures and Seebeck factors are expressed in terms of [°C.] and [$\times 10^{-4}$ $\mu$V/K] respectively.

As seen in the Table and FIG. 10, the overall Seebeck factor c is within a range of 10.3 to 10.4 [$\times 10^{-4}$ $\mu$V/K], and the temperature coefficient of the thermoelectromotive force of the entire thermoelectric element formed as shown in FIG. 6 can be made substantially zero. Thus, according to the invention with such a thermoelectric element, the sensitivity of the element can be improved by the relatively high thermoelectromotive force which is provided by semiconductive ceramic, while in addition, a temperature detecting element, for example, can be implemented so as to achieve easy correction of its temperature coefficient.

Although the above description has been made with reference to a combination of n-type and p-type semiconductive ceramic members, either n-type semiconductive ceramic members alone or p-type semiconductive ceramic members alone, can be similarly combined with each other. As to electrical connection, on the other hand, series connection, parallel connection or a combination thereof can be employed, depending on the desired output-temperature coefficient of thermoelectromotive force.

Regulation of the temperature coefficient of thermoelectromotive force may not necessarily be directed to making the temperature coefficient of thermoelectromotive force substantially zero, but may be directed to attain a positive temperature coefficient of a prescribed level, or a temperature coefficient showing a specific characteristic curve.

Although embodiments of the present invention have been described and illustrated in detail, it is clearly understood that the same is by way of illustration and example only and is not to be taken by way of limitation, the spirit and scope of the present invention being limited only by the terms of the appended claims.

What is claimed is:

1. A compact, miniaturizable thermoelectric element comprising:

a stack comprising a plurality of closely stacked plate members made of semiconductive ceramic materials exhibiting Seebeck effects, each plate member having first and second opposite surfaces which extend in a longitudinal direction of said plate member and in a width direction, a width dimension of said plate member being smaller than a longitudinal dimension, said plurality of plate members also having a thickness dimension which is smaller than said width dimension and being so stacked in a thickness direction that said first and second surfaces of the plate members are arranged alternately within said stack so as to face each other; and an insulating layer and a conductor layer provided adjacent to one another between each facing pair of said first and second surfaces in the stacked arrangement of said plurality of plate members, both said insulating layer and conductor layer being in contact with both of said facing pair of first and second surfaces.

2. A thermoelectric element in accordance with claim 1, wherein said insulating layers and said conductor layers are formed on at least one of each said facing pair of first and second surfaces by thick film printing.

3. A thermoelectric element in accordance with claim 2, wherein said plurality of plate members are stacked before said insulating layers and said conductor layers formed by thick film printing are baked, and then are mechanically fixed in the stacked arrangement by baking of said insulating layers and said conductor layers.

4. A thermoelectric element in accordance with claim 1, wherein said semiconductive ceramic materials forming respective ones of said plate members include first and second semiconductive ceramic materials, said first and second semiconductive ceramic materials having different characteristics from one another.

5. A thermoelectric element in accordance with claim 4, wherein said first semiconductive ceramic material is n-type and said second semiconductive ceramic material is p-type.

6. A thermoelectric element in accordance with claim 4, wherein said first and second semiconductive ceramic materials have Seebeck factors which are different from each other.

7. A thermoelectric element in accordance with claim 1, wherein said conductor layers are located in positions close to respective ends of said first and second surfaces in terms of said longitudinal direction.

8. A thermoelectric element in accordance with claim 7, wherein three or more said plate members are so stacked that those of said conductor layers which are adjacent along the direction of stacking of said plate members are located at opposite ends in terms of said longitudinal direction.

9. A thermoelectric element in accordance with claim 1, wherein said conductor layers define ohmic junction electrodes on said plate members.

10. A thermoelectric element in accordance with claim 5, wherein said first semiconductive ceramic material is mainly composed of Ba-Ti oxide and said second semiconductive ceramic material is mainly composed of Ni-Mn-Cu oxide.

11. A thermoelectric element in accordance with claim 4, wherein said plurality of plate members are connected through said conductor layers so as to increase a thermoelectromotive force which is delivered by the assembly as a whole in response to a temperature difference.

12. A thermoelectric element in accordance with claim 4, wherein said plurality of plate members are connected through said conductor layers so as to regulate the temperature coefficient of thermoelectromotive force which is delivered by the assembly as a whole in response to a temperature difference.

* * * * *